(12) United States Patent
Bilodeau et al.

(10) Patent No.: US 11,530,356 B2
(45) Date of Patent: Dec. 20, 2022

(54) COMPOSITIONS AND METHODS FOR SELECTIVELY ETCHING SILICON NITRIDE FILMS

(71) Applicant: ENTEGRIS, INC., Billerica, MA (US)

(72) Inventors: Steven M. Bilodeau, Fairfield, CT (US); Emanuel I. Cooper, Scarsdale, NY (US); Daniela White, Ridgefield, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 17/388,990

(22) Filed: Jul. 29, 2021

(65) Prior Publication Data
US 2022/0033710 A1 Feb. 3, 2022

Related U.S. Application Data

(60) Provisional application No. 63/058,663, filed on Jul. 30, 2020.

(51) Int. Cl.
| | | |
|---|---|---|
| *C09K 13/06* | (2006.01) | |
| *H01L 21/311* | (2006.01) | |
| *H01L 21/306* | (2006.01) | |
| *H01L 21/02* | (2006.01) | |
| *H01L 21/3213* | (2006.01) | |
| *C09K 13/08* | (2006.01) | |

(52) U.S. Cl.
CPC ............... *C09K 13/06* (2013.01); *C09K 13/08* (2013.01); *H01L 21/0217* (2013.01); *H01L 21/30604* (2013.01); *H01L 21/311* (2013.01); *H01L 21/31105* (2013.01); *H01L 21/31111* (2013.01); *H01L 21/32134* (2013.01)

(58) Field of Classification Search
None
See application file for complete search history.

(56) References Cited

U.S. PATENT DOCUMENTS

| | | | |
|---|---|---|---|
| 8,716,146 B2 | 5/2014 | Nowling | |
| 8,940,182 B2 | 1/2015 | Hong | |
| 10,428,271 B2 | 10/2019 | Cooper | |
| 10,651,045 B2 | 5/2020 | Cooper | |
| 2019/0074188 A1 | 3/2019 | Cooper | |
| 2019/0390110 A1* | 12/2019 | Kim | C09K 13/06 |
| 2020/0157423 A1* | 5/2020 | Bilodeau | C09K 13/06 |

FOREIGN PATENT DOCUMENTS

| | | |
|---|---|---|
| EP | 0498458 A2 | 8/1992 |
| JP | 2010515245 A | 5/2010 |
| JP | 2020088391 A | 6/2020 |
| KR | 100925932 B1 | 11/2009 |

* cited by examiner

*Primary Examiner* — Jiong-Ping Lu

(57) ABSTRACT

Provided are wet etching compositions and methods for etching a surface of a microelectronic device that contains silicon nitride (SiN), silicon oxide, and polysilicon which in one embodiment is in contact with a surface comprising a compound which is electrochemically more noble than silicon, and optionally other materials which may include a conductive material, a semiconducting material, or an insulating material useful in a microelectronic device, or a processing material that is useful in preparing a microelectronic device.

15 Claims, 2 Drawing Sheets

| Example | HF (wt. %) | APST | H₃PO₄ | DIW | Aromox 14D-W970 | PSSA | CAPS | PAA | Flexiwet NF | Flexiwet NI-M | Thetawet FS-8050 | Flexiwet Q22 | DDBSA | Thetawet FS-8150 | Calfax 6LA-70 | Calfax DBA-70 |
|---|---|---|---|---|---|---|---|---|---|---|---|---|---|---|---|---|
| A (comparative) | 0.0020 | 0.0698 | 84.9283 | 15 | 0 | 0 | 0 | 0 | 0 | 0 | 0 | 0 | 0 | 0 | 0 | 0 |
| B (comparative) | 0.0020 | 0.0698 | 84.9283 | 15 | 0 | 0 | 0 | 0 | 0 | 0 | 0 | 0 | 0 | 0 | 0 | 0 |
| C | 0.0020 | 0.0698 | 84.9003 | 15 | 0.028 | 0 | 0 | 0 | 0 | 0 | 0 | 0 | 0 | 0 | 0 | 0 |
| D | 0.0020 | 0.0698 | 84.9003 | 15 | 0 | 0.028 | 0 | 0 | 0 | 0 | 0 | 0 | 0 | 0 | 0 | 0 |
| E | 0.0020 | 0.0698 | 84.9003 | 15 | 0 | 0 | 0.028 | 0 | 0 | 0 | 0 | 0 | 0 | 0 | 0 | 0 |
| F | 0.0020 | 0.0698 | 84.9003 | 15 | 0 | 0 | 0 | 0.028 | 0 | 0 | 0 | 0 | 0 | 0 | 0 | 0 |
| G | 0.0020 | 0.0698 | 84.9003 | 15 | 0 | 0 | 0 | 0 | 0.028 | 0 | 0 | 0 | 0 | 0 | 0 | 0 |
| H | 0.0020 | 0.0698 | 84.9003 | 15 | 0 | 0 | 0 | 0 | 0 | 0.028 | 0 | 0 | 0 | 0 | 0 | 0 |
| I | 0.0020 | 0.0698 | 84.9003 | 15 | 0 | 0 | 0 | 0 | 0 | 0 | 0.028 | 0 | 0 | 0 | 0 | 0 |
| J | 0.0020 | 0.0698 | 84.9003 | 15 | 0 | 0 | 0 | 0 | 0 | 0 | 0 | 0.028 | 0 | 0 | 0 | 0 |
| K | 0.0020 | 0.0698 | 84.9213 | 15 | 0 | 0 | 0 | 0 | 0 | 0 | 0 | 0 | 0.007 | 0 | 0 | 0 |
| L | 0.0020 | 0.0698 | 84.9003 | 15 | 0 | 0 | 0 | 0 | 0 | 0 | 0 | 0 | 0 | 0.028 | 0 | 0 |
| M | 0.0020 | 0.0698 | 84.9213 | 15 | 0 | 0 | 0 | 0 | 0 | 0 | 0 | 0 | 0 | 0 | 0.007 | 0 |
| N | 0.0020 | 0.0698 | 84.9213 | 15 | 0 | 0 | 0 | 0 | 0 | 0 | 0 | 0 | 0 | 0 | 0 | 0.007 |

Composition Examples A through N:

Figure 2

COMPOSITIONS AND METHODS FOR SELECTIVELY ETCHING SILICON NITRIDE FILMS

FIELD OF THE INVENTION

The invention relates generally to compositions and methods for selectively etching silicon nitride films in the presence of silicon dioxide and polysilicon.

BACKGROUND OF THE INVENTION

In the microelectronics industry, ongoing demand exists for improved device performance and for decreased device sizes and decreased device feature sizes. Reduced feature sizes provide dual advantages of increasing device feature density and increasing device speed.

Reducing feature and device sizes requires finding new ways to improve steps of the multi-step process of manufacturing microelectronic devices. In methods for preparing many types of microelectronic devices, a step of removing silicon nitride is common. A thin layer of silicon nitride ($Si_3N_4$), typically deposited by chemical vapor deposition from silane ($SiH_4$) and ammonia ($NH_3$), can be useful in a microelectronic device as a barrier for water and sodium. Also, patterned silicon nitride layers are used as a mask for spatially selective silicon oxide growth. After being applied, all or a portion of these silicon nitride materials may require removal, which is commonly performed by etching.

The removal of silicon nitride from a substrate by etching is advantageously performed in a manner that does not damage or disrupt other exposed or covered features of a microelectronic device. Often, a process of removing silicon nitride is performed in a manner that preferentially removes the silicon nitride relative to other materials that are also present at a surface of a microelectronic device substrate, such as silicon dioxide. According to various commercial methods, silicon nitride is removed from a microelectronic device surface by a wet etching process that involves exposing the substrate surface to concentrated phosphoric acid ($H_3PO_4$) at an elevated temperature, e.g., in a bath having a temperature in a range from 150° C. to 180° C. Conventional wet etching techniques for selectively removing silicon nitride relative to silicon oxide have used aqueous phosphoric acid ($H_3PO_4$) solutions, typically about 85 weight percent phosphoric acid and 15 weight percent water. Using fresh hot phosphoric acid, a typical $Si_3N_4$:$SiO_2$ selectivity can be about 40:1.

In further device structures, in addition to silicon oxide, exposed surfaces of polysilicon may also be present, which further complicates a desired selective silicon nitride etching process. Thus, there is a need for compositions and methods useful for preferentially etching silicon nitride in the presence of silicon oxide and polysilicon surfaces.

SUMMARY OF THE INVENTION

In summary, the invention relates to wet etching compositions for etching a surface of a microelectronic device that contains silicon nitride (SiN), silicon oxide, and polysilicon; in certain embodiments, the polysilicon is in contact with a surface comprising a compound which is electrochemically more noble than silicon. Optionally, other materials are present such as a conductive material, a semiconducting material, or an insulating material useful in a microelectronic device, or a processing material that is useful in preparing a microelectronic device. An etching composition as described comprises phosphoric acid, an aminoalkyl silanol, certain polysilicon corrosion inhibitors, optionally a fluorine compound, and an amount of water that is associated with ingredients of the etching composition or added separately.

BRIEF DESCRIPTION OF THE DRAWINGS

FIG. 2 is a depiction of Table 1 that supports the Examples provided.

DETAILED DESCRIPTION OF THE INVENTION

Figure 1:
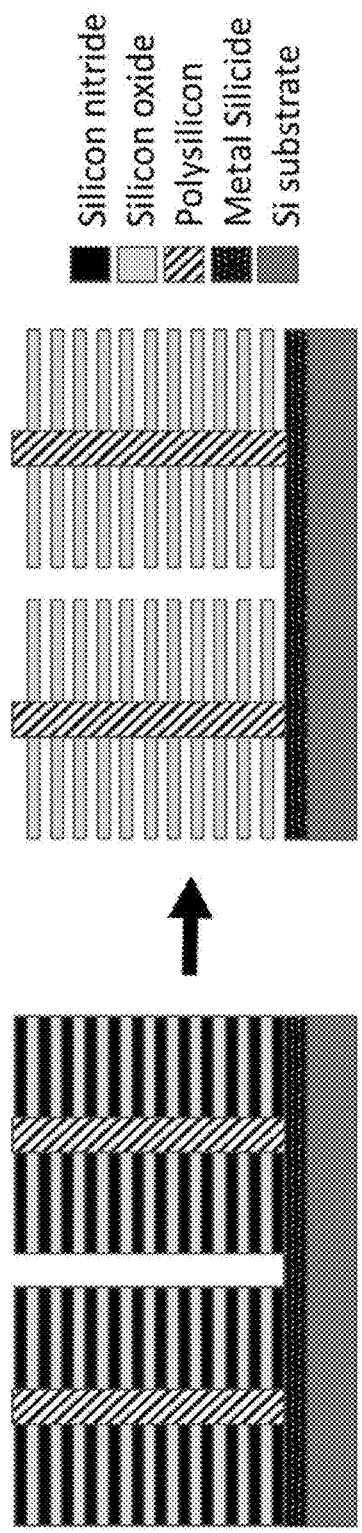
FIG. 1 is a depiction of an exemplary substrate, illustrating a before and after view of an etching step in the practice of the method of the invention.

In a first aspect, the invention provides a method of etching silicon nitride on a microelectronic device substrate, said substrate comprising a surface comprising silicon nitride, a surface comprising silicon oxide, and a surface comprising polysilicon, the method comprising:
providing an etching composition comprising:
a. concentrated phosphoric acid, in an amount of at least 60 weight percent, based on the total weight of the composition;
b. a polysilicon corrosion inhibitor compound;
c. an aminoalkyl silanol; and
d. optionally a fluorine compound;
providing a substrate having a surface that comprises silicon nitride and a surface which comprises polysilicon, and
contacting the substrate with the composition under conditions effective to etch silicon nitride.

In one embodiment, said surface comprising polysilicon is in contact with a surface comprising a composition which is more electrochemically noble than silicon. In one embodiment, the composition does not contain a fluorine compound.

The compositions of the invention are useful as etching compositions in the etching or removal of silicon nitride films on certain microelectronic devices. These compositions have shown unexpectedly superior selectivity in etching silicon nitride in the presence of other materials commonly present in certain microelectronic devices.

As used herein, the term "microelectronic device" (or "microelectronic device substrate," or simply "substrate") is used in a manner that is consistent with the generally understood meaning of this term in the electronics, microelectronics, and semiconductor fabrication arts, for example to refer to any of a variety of different types of: semiconductor substrates; integrated circuits; solid state memory devices; hard memory disks; read, write, and read-write heads and mechanical or electronic components thereof; flat panel displays; phase change memory devices; solar panels and other products that include one or more solar cell devices; photovoltaics; and microelectromechanical systems (MEMS) manufactured for use in microelectronic, integrated circuit, energy collection, or computer chip applications. It is to be understood that the term "microelectronic device" can refer to any in-process microelectronic device or microelectronic device substrate that contains or is being prepared to contain functional electronic (electrical-current-carrying) structures, functional semiconductor structures, and insulating structures, for eventual electronic use in a microelectronic device or microelectronic assembly.

As used herein, the term "silicon nitride" is given a meaning that is consistent with the meaning of the term as used in the microelectronics and semiconductor fabrication industries. Consistent therewith, silicon nitride refers to materials including thin films made of amorphous silicon nitride with commercially useful low levels of other materials or impurities and potentially some variation around the nominal stoichiometry of $Si_3N_4$. The silicon nitride may be present as part of a microelectronic device substrate as a functioning feature of the device, for example as a barrier layer or an insulating layer, or may be present to function as a material that facilitates a multi-step fabrication method for preparing a microelectronic device.

As used herein, the term "silicon oxide" is given a meaning that is consistent with the meaning of the term as used in the microelectronics and semiconductor fabrication industries. Consistent therewith, silicon oxide refers to thin films made of silicon oxide ($SiO_x$), e.g., $SiO_2$, "thermal oxide" ($ThO_x$), and the like. The silicon oxide can be placed on the substrate by any method, such as by being deposited by chemical vapor deposition from TEOS or another source, or by being thermally deposited. The silicon oxide can advantageously contain a commercially useful low level of other materials or impurities. The silicon oxide may be present as part of a microelectronic device substrate as a feature of the microelectronic device, for example as an insulating layer.

As used herein, the term "polysilicon" has its ordinary understood meaning of the term as used in the microelectronics and semiconductor fabrication industries as a polycrystalline form of silicon. In other words, polysilicon, or "poly-Si", is a high purity polycrystalline form of silicon that may be doped to modify its electrical properties.

Reference herein to a polysilicon surface in contact with a surface comprising a composition which is electrochemically more noble than silicon is intended to describe surfaces which are capable of effecting galvanic corrosion (of the polysilicon) when in contact with polysilicon. The term "noble" as used herein is intended to refer to the quality of various noble elements which reflect their character as elements which are resistant to oxidation and corrosion in an aqueous environment. Thus, surfaces and compositions which comprise such surfaces are sufficiently more "noble" than silicon when they are susceptible of generating an electrochemical flux and hence corrosive degradation over time when in intimate contact with polysilicon in an aqueous environment. As described herein, the methods and compositions of the present invention are particularly useful in selectively etching silicon nitride on a microelectronic device substrate which also possesses such polysilicon structures or surfaces in contact with such "more noble surfaces". Examples of such surfaces include tungsten silicide, nickel silicide, platinum silicide, and titanium silicide.

Embodiments of certain etching compositions include compositions in the form of aqueous solutions that comprise, consist essentially of, or consist of: aqueous phosphoric acid (e.g., concentrated phosphoric acid and an optional an amount of added water) with a fluorine compound in amounts that are effective to produce desired etching (including a useful or advantageous etch rate) of silicon nitride; an aminoalkyl silanol in an amount effective to improve selectivity of silicon nitride relative to silicon oxide; an effective amount of one or more certain galvanic inhibitors, and optionally dissolved silica. These and other example compositions can comprise, consist of, or consist essentially of the recited ingredients and optional ingredients. As a general convention throughout the present description a composition of matter such as an etching composition as described, or an ingredient or component thereof, that is said to "consist essentially of" a group of specified ingredients or materials refers to a composition that contains the specified ingredients or materials with not more than a low or insignificant amount of other ingredients or materials, e.g., not more than 5, 2, 1, 0.5, 0.1, or 0.05 parts by weight of other ingredients or materials. For example, an etching composition that contains materials that consist essentially of: aqueous phosphoric acid, an amino alkyl silane, a polysilicon corrosion inhibitor, and optional ingredients as described, means an etching composition that contains these ingredients and not more than 5, 2, 1, 0.5, 0.1, or 0.05 parts by weight of any other dissolved or un-dissolved material or materials (individually or as a total) other than the identified materials.

The etching composition includes aqueous phosphoric acid (e.g., concentrated phosphoric acid) in an amount that is effective to produce desired etching of silicon nitride. The term "aqueous phosphoric acid" refers to an ingredient of the etching composition that is mixed or combined with other ingredients of the etching composition to form the etching composition. The term "phosphoric acid solids" refers to the non-aqueous component of an aqueous phosphoric acid ingredient, or of an etching composition that is prepared from aqueous phosphoric acid ingredient.

The amount of phosphoric acid solids contained in an etching composition can be an amount that, in combination with the other materials of an etching composition, will provide desired etching performance, including desired silicon nitride etch rate and selectivity, which typically requires a relatively high amount (concentration) of phosphoric acid solids. For example, an etching composition can contain an amount of phosphoric acid solids that is at least about 50 weight percent based on total weight of the etching composition, e.g., at least 70, or at least about 80 or 85 weight percent phosphoric acid solids based on total weight of the etching composition.

To provide a desired amount of phosphoric acid solids, the composition may contain "concentrated" phosphoric acid as an ingredient that is mixed or combined with other ingredients (one ingredient optionally being water, in some form) to produce the etching composition. "Concentrated" phosphoric acid refers to an aqueous phosphoric acid ingredient that contains a high or maximum amount of phosphoric acid solids in the presence of a low or minimum amount of water and substantially no other ingredients (e.g., less than 0.5 or 0.1 weight percent of any non-water or non-phosphoric acid solids materials). Concentrated phosphoric acid can typically be considered to have at least about 80 or 85 weight percent phosphoric acid solids in about 15 or 20 weight percent water. Alternately, the etching composition may be considered to include an amount of concentrated phosphoric acid that is diluted with water, meaning for example concentrated phosphoric acid that has been diluted with an amount of water before or after being combined with other ingredients of the etching composition, or an equivalent formed in any manner. As another alternative, an ingredient of the etching composition can be concentrated phosphoric acid or a diluted phosphoric acid, and the etching composition can contain an additional amount of water that is provided to the etching composition either as a component of a different ingredient or as a separate water ingredient.

As an example, if concentrated phosphoric acid is used to form the composition, the amount of concentrated phosphoric acid (85 weight percent, in water) can be an amount that is at least 60, e.g., at least 80 or at least 90, 93, 95, or at least 98 weight percent of the etching composition, based on total weight etching composition.

As used herein, the term "fluorine compound" refers to certain etchants which are optionally added to increase the etch rate of the titanium nitride. Such compounds include, but are not limited to, HF, ammonium fluoride, tetrafluoroboric acid, hexafluorosilicic acid, other compounds containing B—F or Si—F bonds, tetrabutylammonium tetrafluoroborate (TBA-BF$_4$), tetraalkylammonium fluoride (NR$_1$R$_2$R$_3$R$_4$F), and combinations thereof. In one embodiment, the fluoride compound is chosen from HF, ammonium fluoride, tetrafluoroboric acid, hexafluorosilicic acid, tetrabutylammonium tetrafluoroborate, tetra(C$_1$-C$_6$ alkyl)ammonium fluorides, and combinations thereof. In another embodiment the fluorine compound can include any fluorine compounds covalently bonded to carbon, which can be any CF2 or CF3 groups or any fluorosurfactant groups.

The amount of the optional fluorine compound contained in the compositions of the invention can be an amount that, in combination with the other materials of an etching composition, will provide desired etching performance, including desired silicon nitride etch rate and selectivity. For example, an etching composition can contain an amount of a fluorine source compound in a range from about 5 to 10,000 or even up to 50,000 parts per million (i.e., from 0.0005 to 1 or even 5 weight percent) based on total weight of the etching composition, such as from about 20 to 2,000 parts per million (i.e., from 0.002 to 0.2 weight percent) based on total weight of the etching composition.

The composition comprises an aminoalkyl silanols, which, as these terms are used herein, refers to a silane (—SiO—)-based compound or molecule that contains at least one silicon atom and at least one amine group located on an alkyl substituent of the compound, i.e., an aminoalkyl substituent connected to the silicon atom. The silanol functionality may be present in the formulation as manufactured or may be formed by hydrolysis when added to the formulation or under process conditions. For example, silicon alkoxides are known to hydrolyze rapidly under strongly acidic conditions, and siloxanes will hydrolyze under process conditions.

In certain embodiments, the aminoalkyl silanol compounds have the formulae:

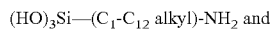
(HO)$_3$Si—(C$_1$-C$_{12}$ alkyl)-NH$_2$ and

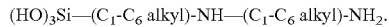
(HO)$_3$Si—(C$_1$-C$_6$ alkyl)-NH—(C$_1$-C$_6$ alkyl)-NH$_2$.

According to the invention, Applicant has found that the presence of an aminoalkyl silanol compound as part of an etching composition that contains phosphoric acid in combination with a fluorine compound and a polysilicon corrosion inhibitor can exhibit improved performance as described herein.

Examples of aminoalkyl silanols include 3-aminopropylsilanetriol, N-(6-aminohexyl)aminopropyl silanol, N-(2,aminoethyl)-(2,aminoethyl)-3-aminopropylsilanetriol, and (3-trimethoxysilylpropyl) diethylenetriamine.

In the compositions of the invention, the amount of aminoalkyl silanol contained in such compositions can be an amount that, in combination with the other materials of an etching composition, will provide the desired selective etching performance, including desired silicon nitride etch rate and selectivity vis a vis silicon dioxide and polysilicon. For example, an etching composition can contain an amount of an aminoalkyl silanol compound, which may be a single species or a combination of two or more species, in a range from about 20 to 10,000 parts per million (i.e., from 0.0020 to 1.0 weight percent) based on the total weight of the composition, or from about 20 to 2,000, 4,000, or 5,000 parts per million (i.e., from 0.002 to 0.2, 0.4, or 0.5 weight percent) based on the total weight of the composition.

The compositions of the invention utilize at least one compound which functions as a polysilicon inhibitor during the selective etching of silicon nitride in the presence of polysilicon. In this regard, without wishing to be bound by theory, Applicants believe that this component in the composition serves to inhibit corrosion of the polysilicon surface by inhibiting electron flow and/or transport of corrosion products when such polysilicon surface(s) is in contact with a surface comprising a material which is more noble than silicon. In this regard, we have discovered a number of compounds which can serve this goal of polysilicon corrosion inhibition, certain of which can be categorized as surfactants. Examples include:

decyltrimethylammonium chloride
dodecyltrimethylammonium chloride
Hexadecyltrimethylammonium chloride
4-Phenylpyridine N-oxide
CAPS (3-(Cyclohexylamino)-1-propanesulfonic acid)
Trimethylamine N-oxide
4-Aminobenzenesulfonic acid
Dodecylamine
Isonicotinic Acid N-Oxide
Trimethylphenylammonium Chloride
4-(Cyclohexylamino)-1-butanesulfonic acid (CABS)
Lauryldimethylamine oxide
1-Decyl-3-methylimidazolium chloride
[2-(Dicyclohexylphosphino)ethyl]trimethylammonium chloride
Tomamine AO-405
Nicotinic Acid N-Oxide
Poly(4-vinylpyridine)
4-(Benzyloxy)pyridine N-oxide
1-Octyl-2-pyrrolidone
1-Dodecyl-2-pyrrolidinone
Ammonium Dinonyl Sulfosuccinate
Poly(4-styrenesulfonic acid)
TOLYLTRIAZOLE
Myristyldimethylamine N-oxide (N-oxide, tetradecyl diemthylamine)
1-Octanesulfonic acid
Benzyltrimethylammonium chloride
p-Aminobenzenesulfonamide
Pyridine N-oxide
Polyethylenimine
Polyacrylic acid
Polyvinylpyrrolidone
Thetawet FS-8150
2,5 Dimethylphenylacetic acid
2-Hydroxypyridine n-oxide
4-(Cyclohexylamino)-1-butanesulfonic acid (CABS)
Tetradecyldimethyl amine oxide)
Benzalkonium chloride
Hexyl diphenyl oxide disulfonic acid (5-hexyl-2-(4-hexyl-2-sulfophenoxy)benzenesulfonic acid)
Dodecyl diphenyl oxide disulfonic acid (5-dodecyl-2-(4-dodecyl-2-sulfophenoxy)benzenesulfonic acid)
Capstone FS-35 (fluorosurfactant)
Dodecylbenzenesulfonic acid (DDBSA)
Flexiwet® NF (Low foam, anionic fluorosurfactant)
Flexiwet® NI-M (Fluorinated Nonionic Surfactant)
Heptane-4-sulfonic acid
p-Tolyacetic acid
Sulfosuccinic acid Thetawet FS-8050 (nonionic ethoxylated fluorosurfactant)
Tomamine AO-14-2 (50% active bis-(2-hydroxyethyl) iso-decyloxypropylamine oxide)

In one embodiment, the polysilicon corrosion inhibitor is chosen from linear and branched $C_8$-$C_{16}$ alkylbenzenesulfonic acids. Examples include octylbenzenesulfonic acid, nonylalkylbenzenesulfonic acid, decylbenzesulfonic acid, undecylbenzenesulfonic acid, dodecylbenzenesulfonic acid, tridecylbenzenesulfonic acid, tetradecylbenzenesulfonic acid, tetradecylbenzenesulfonic acid, pentadecylbenzenesulfonic acid, hexadecylbenzenesulfonic acid, heptadecylbenzesulfonic acid, octadecylbenzenesulfonic acid, and $C_6$-$C_{16}$ alkyldiphenyl sulfide disulfonic acids, and $C_6$-$C_{16}$ alkyldiphenylamine disulfonic acids.

In one embodiment the polysilicon corrosion inhibitor is dodecylbenzenesulfonic acid.

In one embodiment, the polysilicon corrosion inhibitor is chosen from a chalogenide, or $C_6$-$C_{16}$ alkyldiphenyl oxide disulfonic acids. In one embodiment, the polysilicon corrosion inhibitor is chosen from hexyl diphenyl oxide disulfonic acid and dodecyl diphenyl oxide disulfonic acid.

Optionally, the compositions of the invention can also contain an amount of silica dissolved in the phosphoric acid, e.g., by dissolving solid silica material in the phosphoric acid or by adding a soluble silicon-containing compound that can form dissolved silica by reaction with aqueous phosphoric acid, examples of such compounds including TMAS (tetramethylammonium silicate), tetraacetoxysilane, or a tetraalkoxysilane such as tetramethoxysilane, tetraethoxysilane, or the like. The dissolved silica may be effective to improve selectivity of an etching composition toward silicon nitride. The amount may be any useful amount that does not lead to pre-processing silica supersaturation at conditions of an etching process, such as from about 5 to 10,000 parts per million dissolved silica or soluble silicon-containing compound based on total weight of the etching composition, or from about 20 to 5,000, 3,000, 1,000, or 500 parts per million based on total weight of the etching composition.

The etching composition can contain water from one or from multiple sources. For example, water will be present in an aqueous phosphoric acid ingredient. Additionally, water may be used as a carrier for one or more of the other ingredients of the composition, and water may be added alone as its own ingredient. The amount of water should be sufficiently low to allow the composition to exhibit desired or preferred or advantageous performance properties, including a useful (sufficiently high) silicon nitride etch rate. An increase in the presence of water tends to increase the etch rate of silicon nitride but can also depress the boiling point of the composition, which forces a reduction in operating temperature of the composition and an opposite effect. Examples of amounts of water, from all sources, in an etching composition, can be less than about 50, 40, or 30 weight percent, for example in a range from about 5 weight percent to about 25 percent by weight, based on total weight of the etching composition, or in a range from about 10 to 20 weight percent water based on total weight of the etching composition.

Optionally, these and other example etching compositions as described can contain, consist of, or consist essentially of the phosphoric acid, an aminoalkyl silane, at least one polysilicon corrosion inhibitor, and any one or any combination of the identified optional ingredients. In certain embodiments, the compositions of the invention do not require and may exclude other types of ingredients not typically included in an etching composition, such as a pH adjusting agent (other than the acids mentioned as potential ingredients herein) and solid materials such as abrasive.

The compositions of the invention can be prepared by any method that will be useful to produce an etching composition as described. By one method, aqueous or solid ingredients can be combined, optionally with heat, any mixed to uniformity.

A composition as described can be useful for methods of removing silicon nitride from a surface of a microelectronic device substrate. The substrate can contain other materials that are useful in a microelectronic device, such as one or more of an insulator, barrier layer, conducting material, semiconducting material, or a material that is useful for processing a microelectronic device (e.g., photoresist, mask, among others). Example substrates have a surface that includes silicon nitride, thermal oxide (ThOx) and PETEOS (oxide deposited using plasma enhanced tetra ethyl ortho silicate) as well as polysilicon.

In use, the compositions of the invention can provide etching performance that is useful based on commercial performance needs and expectations, and as compared to comparative etching compositions, can provide improved performance with respect to etch rate and selectivity of silicon nitride.

Methods of etching microelectronic device substrates are known in the semiconductor fabrication art and can be performed on known and commercially available equipment. Generally, to etch a substrate to selectively remove a material at a surface of the substrate, etching composition can be applied to the surface and allowed to contact surface structures to selectively remove certain of the structures, chemically.

Silicon nitride films occasionally have a thin oxidized surface that can inhibit the etching process, since the composition is designed to etch oxide very slowly. In such cases, a very brief treatment with dilute HF can be an advantageous first process step.

In an etching step, the etching composition can be applied to the surface in any suitable manner, such as by spraying the etching composition onto the surface; by dipping (in a static or dynamic volume of the composition) the substrate into etching composition; by contacting the surface with another material, e.g., a pad, or fibrous sorbent applicator element, that has etching composition absorbed thereon; by contacting the substrate with an amount of the etching composition in a circulating pool; or by any other suitable means, manner or technique, by which the etching composition is brought into removal contact with the surface of the microelectronic substrate that contains silicon-germanium and silicon. The application may be in a batch or single wafer apparatus, for dynamic or static cleaning.

The conditions (e.g., time and temperature) of a useful etching process can be any that are found to be effective or advantageous. Generally, etching composition is contacted with the surface, such as by submersion in a bath of the etching composition, for a time that is sufficient to selectively remove silicon nitride. The time of exposure to the etching composition and the temperature of the etching composition can be effective for a desired amount of removal of the silicon nitride from a surface of the substrate. The amount of time for an etching step should not be too short, because this means that an etch rate of silicon nitride may be too high, which can lead to process control difficulties and reduced quality of a microelectronic device at the end of an etch step. Of course, the amount of time required for an etch step is preferably not unduly long, to allow good efficiency and throughput of an etching process and semiconductor fabrication line. Examples of useful times for an etching step may be in a range from about 5 minutes to about 200 minutes, or about 10 minutes to about 60 minutes, at a temperature in a range of from about 100° C. to about 180° C. Such contacting times and temperatures are illustrative, and any other suitable time and temperature conditions may be employed that are efficacious to achieve the required removal selectivity.

An etching step of the present description can be useful to etch silicon nitride material from a surface of any type of substrate. According to particular embodiments, a substrate can include alternating thin film layers of silicon nitride as structural features of a substrate that includes alternating thin film layers of the silicon nitride layers with silicon oxide as well as polysilicon, conductive metal silicides and dielectrics such as zirconium oxide or aluminum oxide. The silicon oxide layers are high aspect ratio structures that contain the silicon nitride layers disposed between the layers of silicon oxide. Referring to FIG. 1, a substrate is shown before and after a selective etch step as described herein that is effective to remove silicon nitride from a substrate in a selective manner, e.g., preferentially relative to silicon oxide. The substrate before the etch step includes the alternating layers of silicon nitride positioned in openings between high aspect ratio silicon oxide structures. The etch step removes the silicon nitride to leave behind the silicon oxide layers, as shown as the right-side substrate of FIG. 1, with openings or "slits" separating the silicon oxide layers. According to the present description, an etching process can be used as illustrated at FIG. 1 to etch a substrate shown at FIG. 1. Example etching processes can exhibit a significantly increased SiN etch rate, good selectivity relative to silicon oxide (>50, preferably close to or above 100), and avoidance of major silica redeposition (as evidenced by closure or near-closure of the slit openings), as compared to prior art and comparable etching compositions and etching processes.

After completion of a desired amount of selective etching of silicon nitride, etching composition that remains on a surface of an etched microelectronic device can be removed from the surface by any desired and useful method, such as by a rinse, wash, or other removal step, using water (or optionally phosphoric acid followed by water). For example, after etching, a microelectronic device substrate may be rinsed with a rinse of deionized water (e.g., at a temperature in a range from about 20 to about 90 degrees Celsius) followed by drying, e.g., spin-dry, $N_2$, vapor-dry etc. Following the rinse, the substrate surface may be measured for the presence and amount of particles at the surface.

As noted above, the compositions of the invention, due to the presence of the polysilicon corrosion inhibitor component, exhibit surprisingly superior selectivity in a wet etching environment on a microelectronic device substrate which possesses polysilicon-coated regions. Accordingly, in a further aspect, the invention provides a composition comprising:
 a. concentrated phosphoric acid, in an amount of at least 60 weight percent, based on the total weight of the composition;
 b. a polysilicon corrosion inhibitor compound chosen from chosen from linear and branched $C_8$-$C_{16}$ alkylbenzenesulfonic acids and $C_6$-$C_{12}$ alkyldiphenyl oxide disulfonic acids; and
 c. an aminoalkyl silanol.

In certain embodiments, the aminoalkyl silanol is chosen from 3-aminopropylsilanetriol, N-(6-aminohexyl)aminopropylsilanol, 3-aminopropyltriethoxide and 3-aminopropyltrimethoxide and (3-trimethoxysilylpropyl) diethylenetriamine. In certain embodiments, the polysilicon corrosion inhibitor is chosen from hexyl diphenyl oxide disulfonic acid, dodecyl diphenyl oxide disulfonic acid, and dodecylbenzenesulfonic acid. In certain embodiments, the composition further comprises a fluorine compound, for example HF.

In one embodiment, the composition comprises:
 a. concentrated phosphoric acid, in an amount of at least 60 weight percent, based on the total weight of the composition;
 b. dodecylbenzenesulfonic acid; and
 c. 3-aminopropylsilanetriol. In one embodiment, the composition further comprises HF.

In one embodiment, the composition comprises:
 a. concentrated phosphoric acid, in an amount of at least 60 weight percent, based on the total weight of the composition;
 b. a polysilicon corrosion inhibitor compound chosen from linear and branched $C_6$-$C_{16}$ alkylbenzenesulfonic acids; and $C_6$-$C_{16}$ alkyldiphenyl oxide disulfonic acid
 c. an aminoalkyl silanol; and optionally
 d. a fluorine compound.

In one embodiment, the polysilicon corrosion inhibitor compound is chosen from dodecylbenzenesulfonic acid, dodecyldiphenyl oxide disulfonic acid, and hexyldiphenyl oxide disulfonic acid.

In one embodiment, the aminoalkyl silanol compounds have the formulae:

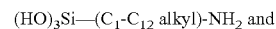

$(HO)_3Si$—$(C_1$-$C_{12}$ alkyl)-$NH_2$ and

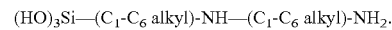

$(HO)_3Si$—$(C_1$-$C_6$ alkyl)-$NH$—$(C_1$-$C_6$ alkyl)-$NH_2$.

In one embodiment, the alkylamino silanol is chosen from 3-aminopropylsilanetriol and N-(6-aminohexyl)aminopropyl silanol. In another embodiment, the fluorine compound is HF, the polysilicon corrosion inhibitor compound is dodecylbenzenesulfonic acid, and the aminoalkyl silane is 3-aminopropylsilanetriol.

It will be appreciated that it is common practice to make concentrated forms of the semi-aqueous composition to be diluted prior to use. For example, the composition may be manufactured in a more concentrated form and thereafter diluted with at least one solvent at the manufacturer, before use, and/or during use at the fab. Dilution ratios may be in a range from about 0.1 part diluent:1 part composition concentrate to about 100 parts diluent:1 part composition concentrate. The compositions described herein can be easily formulated by simple addition of the respective ingredients and mixing to homogeneous condition. Furthermore, the compositions may be readily formulated as single-package formulations or multi-part formulations that are mixed at or before the point of use, preferably multi-part formulations. The individual parts of the multi-part formulation may be mixed at the tool or in a mixing region/area such as an inline mixer or in a storage tank upstream of the tool. It is contemplated that the various parts of the multi-part formulation may contain any combination of ingredients/constituents that when mixed together form the desired composition. The concentrations of the respective ingredients may be widely varied in specific multiples of the semi-aqueous composition, i.e., more dilute or more concentrated, and it will be appreciated that the semi-aqueous compositions can variously and alternatively comprise, consist or consist essentially of any combination of ingredients consistent with the disclosure herein.

Accordingly, in third aspect, the invention provides a kit including, in one or more containers, one or more components adapted to form the compositions described herein. The containers of the kit must be suitable for storing and shipping said semi-aqueous composition components, for example, NOWPak® containers (Advanced Technology Materials, Inc., Danbury, Conn., USA). The one or more containers which contain the components of the composition preferably include means for bringing the components in said one or more containers in fluid communication for blending and dispense. For example, referring to the NOW-Pak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended composition to a process tool.

Substantially chemically inert, impurity-free, flexible and resilient polymeric film materials, such as high density polyethylene, can be used to fabricate the liners for said one or more containers. Desirable liner materials are generally processed without requiring co-extrusion or barrier layers, and without any pigments, UV inhibitors, or processing agents that may adversely affect the purity requirements for components to be disposed in the liner. A listing of desirable liner materials include films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" and PCT/US08/63276 entitled "SYSTEMS AND METHODS FOR MATERIAL BLENDING AND DISTRIBUTION" filed on May 9, 2008.

This invention can be further illustrated by the following examples of certain embodiments thereof, although it will be understood that these examples are included merely for purposes of illustration and are not intended to limit the scope of the invention unless otherwise specifically indicated.

EXAMPLES

The corrosion of polysilicon by selective silicon nitride etches can be modified by addition of a small amount of a wide variety of polysilicon corrosion inhibitors. Without these inhibitors polysilicon surfaces have high overall erosion rates and non-uniform erosion that results in rough films. An example of a selective silicon nitride etch formulation is shown in example A. This consists of concentrated phosphoric acid with a small amount of 3-aminopropylsilanetriol added to reduce redeposition of dissolved silicon. A small amount of HF is also included to increase the silicon nitride removal rate.

A wide variety of compounds have been found to modify polysilicon corrosion behavior (i.e., act as inhibitors) in selective nitride etches (Table 1 shown in FIG. 2). The performance of some of these polysilicon corrosion inhibitors is shown in table 3. Before exposure to selective silicon nitride etch formulations, the native oxide was removed using 0.5 wt % HF in water for 60 seconds at ambient temperature with a 2-minute flowing deionized water rinse. The corrosion rate was measured using polysilicon loss during 1-hour exposures at 150° C. The galvanic polysilicon corrosion rate was measured using a structure that has a polysilicon film in contact with a more noble metal and both films in contact with the etch solution.

Legend

APST: 3-aminopropylsilanetriol
DIW: deionized water
Aromox 14D-W970: tetradecyldimethyl amine oxide
PSSA: poly(4-styrenesulfonic acid)
CAPS: 3-(cylohexylamino)-1-propanesulfonic acid
PAA: poly(acrylic acid)
FlexiWet® NF: low foaming fluorosurfactant
FlexiWet® NI-M: water soluble nonionic fluorosurfactant
Thetawet™ FS-8050: 50% active water soluble nonionic surfactant
FlexiWet® Q22: cationic fluorosurfactant
DDBSA: dodecylbenzenesulfonic acid
Thetawet™ FS-8150: nonionic flurosurfactant
Calfax® 6LA-70: 72% active C-6 linear diphenyl oxide disulfonic acid
Calfax® DBA-70: 71% active C-12 branched diphenyl oxide disulfonic acid
Performance Data:

| Example | Galvanic Polysilicon Corrosion Rate (nm/minute) | Polysilicon Corrosion Rate (nm/minute) |
| --- | --- | --- |
| A(comparative) | 1.90 | 1.21 |
| B(comparative) | 1.19 | 0.95 |
| C | 1.01 | 1.21 |
| D | 1.60 | 1.13 |
| E | 1.28 | 1.10 |
| F | 1.30 | 1.01 |
| G | 1.33 | 0.87 |
| H | 1.15 | 0.82 |
| I | 0.35 | 0.20 |
| J | 0.85 | 0.16 |
| K | 0.17 | 0.10 |
| L | 0.01 | 0.08 |
| M | 0.09 | 0.06 |
| N | 0.13 | 0.00 |

Example A shows the polysilicon corrosion rate for the base formulation. This has the highest polysilicon corrosion rate and an approximately 50% higher galvanic corrosion rate. In examples B through N, 45 ppm dissolved silicon was added using tetramethylammonium silicate to the solution to mimic a typical solution concentration that would be present after partial etching of silicon nitride during a typical silicon nitride removal process. Example B consists of the base formulation with added dissolved silicon. There is a small reduction of in both general corrosion and galvanic corrosion. In examples C through N galvanic inhibitors and 45 ppm dissolved silicon have been added to the base formulation. In examples C, D, E and F the corrosion rates are not reduced by the additive, but the removal is more uniform resulting in a smoother surface. In examples G through N the corrosion rates are suppressed.

The invention has been described in detail with particular reference to certain embodiments thereof, but it will be understood that variations and modifications can be affected within the spirit and scope of the invention.

The invention claimed is:

1. A method of etching silicon nitride on a microelectronic device substrate, said substrate comprising a surface comprising silicon nitride, a surface comprising silicon oxide, and a surface comprising polysilicon, the method comprising:
   providing an etching composition comprising:
   a. concentrated phosphoric acid, having at least about 80 weight percent phosphoric acid solids in about 20 weight percent water, in an amount of at least 60 weight percent, based on the total weight of the composition;
   b. a polysilicon corrosion inhibitor compound chosen from chosen from linear and branched $C_8$-$C_{16}$ alkylbenzenesulfonic acids, and $C_6$-$C_{16}$ alkyldiphenyl oxide disulfonic acids, $C_6$-$C_{16}$ alkyldiphenyl sulfide disulfonic acids, or $C_6$-$C_{16}$ alkyldiphenylamine disulfonic acids;
   c. an aminoalkyl silanol; and
   d. optionally a fluorine compound;
   providing a substrate having a surface that comprises silicon nitride and a surface which comprises polysilicon, and
   contacting the substrate with the composition under conditions effective to etch silicon nitride.

2. The method of claim 1, wherein said surface comprising polysilicon is in contact with a surface comprising a composition which is more electrochemically noble than silicon.

3. The method of claim 2, wherein the surface comprising a composition which is more noble than silicon is chosen from tungsten silicide, nickel silicide, platinum silicide, and titanium silicide.

4. The method of claim 1, wherein the fluorine compound is present and is chosen from HF, ammonium fluoride, tetrafluoroboric acid, hexafluorosilicic acid, tetrabutylammonium tetrafluoroborate, tetra($C_1$-$C_6$ alkyl)ammonium fluorides, and combinations thereof.

5. The method of claim 4, wherein the fluorine compound is HF.

6. The method of claim 5, wherein the aminoalkyl silanol is formed in situ from an aminoalkoxy silane.

7. The method of claim 1, wherein the fluorine compound is a fluorosurfactant.

8. The method of claim 1, wherein the aminoalkyl silanol is chosen from 3-aminopropylsilanetriol, N-(6-aminohexyl) aminopropylsilanol, 3-aminopropyltriethoxide and 3-aminopropyltrimethoxide and (3-trimethoxysilylpropyl) diethylenetriamine.

9. The method of claim 1, wherein the polysilicon corrosion inhibitor is chosen from linear and branched $C_8$-$C_{16}$ alkylbenzenesulfonic acids.

10. The method of claim 1, wherein the polysilicon corrosion inhibitor is chosen from $C_6$-$C_{16}$ alkyldiphenyl oxide disulfonic acids, $C_6$-$C_{16}$ alkyldiphenyl sulfide disulfonic acids, and $C_6$-$C_{16}$ alkyldiphenylamine disulfonic acids.

11. The method of claim 1, wherein the polysilicon corrosion inhibitor is chosen from hexyl diphenyl oxide disulfonic acid, dodecyl diphenyl oxide disulfonic acid, and dodecylbenzenesulfonic acid.

12. The method of claim 1, wherein the substrate is contacted with the composition at a temperature of about 130° to about 180° C.

13. The method of claim 1, wherein the composition is comprised of:
   a. concentrated phosphoric acid, in an amount of at least 60 weight percent, based on the total weight of the composition;
   b. dodecylbenzenesulfonic acid; and
   c. 3-aminopropylsilanetriol.

14. The method of claim 1, wherein the composition is comprised of
   a. concentrated phosphoric acid, in an amount of at least 60 weight percent, based on the total weight of the composition;
   b. a $C_6$-$C_{16}$ alkyldiphenyl oxide disulfonic acid, $C_6$-$C_{16}$ alkyldiphenyl sulfide disulfonic acid, or $C_6$-$C_{16}$ alkyldiphenylamine disulfonic acid; and
   c. 3-aminopropylsilanetriol.

15. The method of claim 1, further comprising a fluorine compound.

* * * * *